(12) United States Patent
Corson

(10) Patent No.: US 8,734,619 B1
(45) Date of Patent: May 27, 2014

(54) METHOD OF SENSING LOCAL SPUTTERING TARGET SELENIZATION

(75) Inventor: John Corson, Mountain View, CA (US)

(73) Assignee: Hanergy Holding Group Ltd., Beijing (CN)

(*) Notice: Subject to any disclaimer, the term of this patent is extended or adjusted under 35 U.S.C. 154(b) by 373 days.

(21) Appl. No.: 13/038,611

(22) Filed: Mar. 2, 2011

(51) Int. Cl.
*C23C 14/06* (2006.01)

(52) U.S. Cl.
USPC ............ 204/192.13; 204/298.13; 204/298.06; 428/648; 438/758; 398/129

(58) Field of Classification Search
None
See application file for complete search history.

(56) References Cited

U.S. PATENT DOCUMENTS

| | | | |
|---|---|---|---|
| 6,365,010 B1 | 4/2002 | Hollars | |
| 6,488,824 B1 | 12/2002 | Hollars et al. | |
| 6,488,825 B1 * | 12/2002 | Hilliard | 204/298.06 |
| 6,748,177 B1 * | 6/2004 | Upton | 398/129 |
| 6,974,976 B2 | 12/2005 | Hollars | |
| 7,838,763 B2 | 11/2010 | Hollars | |
| 2010/0212733 A1 | 8/2010 | Schmidt et al. | |
| 2010/0276282 A1 * | 11/2010 | Hollars | 204/298.13 |

OTHER PUBLICATIONS

Thomas Nelis, Richard Payling, "Glow Discharge Optical Emission Spectroscopy: A Practical Guide", Royal Society of Chemistry, 2003. vol. 7, p. 130.*
"Chalcopyrite CuGaxIn1-xSe2 Semiconducting Thin Films Produced by Radio Frequency Sputtering," J.L. Hernandez-Rojas et al., Applied Physics Letter 60 (15), Apr. 13, 1992, 4pgs.
"Structural and Optical Characterization of RF Reactively Sputtered CuInS2 Thin Films," Y.B. He, et al., Elsevier Science B.V., 2002, 3pgs.

* cited by examiner

*Primary Examiner* — Keith Hendricks
*Assistant Examiner* — Timon Wanga
(74) *Attorney, Agent, or Firm* — The Marbury Law Group PLLC

(57) ABSTRACT

A method including directing a first radiation at a first copper-indium-gallium (CIG) sputtering target in a reactive copper indium gallium selenide (CIGS) sputtering process, detecting a first reflected radiation from the first CIG target and determining the amount of selenium poisoning of the first CIG target based on the first reflected radiation.

23 Claims, 3 Drawing Sheets

US 8,734,619 B1

METHOD OF SENSING LOCAL SPUTTERING TARGET SELENIZATION

FIELD

The present invention is directed to reactive sputtering and more particular to sensing the local selenization of a sputtering target.

BACKGROUND

Copper indium diselenide ($CuInSe_2$, or CIS) and its higher band gap variants copper indium gallium diselenide ($Cu(In,Ga)Se_2$, or CIGS), copper indium aluminum diselenide ($Cu(In,Al)Se_2$), copper indium gallium aluminum diselenide ($Cu(In,Ga,Al)Se_2$) and any of these compounds with sulfur replacing some of the selenium represent a group of materials, referred to as copper indium selenide CIS based alloys, have desirable properties for use as the absorber layer in thin-film solar cells. To function as a solar absorber layer, these materials should be p-type semiconductors. This may be accomplished by establishing a slight deficiency in copper, while maintaining a chalcopyrite crystalline structure. In CIGS, gallium usually replaces 20% to 35% of the normal indium content to raise the band gap; however, there are significant and useful variations outside of this range. If gallium is replaced by aluminum, smaller amounts of aluminum are used to achieve the same band gap.

SUMMARY

An embodiment relates to a method including directing a first radiation at a first copper-indium-gallium (CIG) sputtering target in a reactive copper indium gallium selenide (CIGS) sputtering process, detecting a first reflected radiation from the first CIG target and determining the amount of selenium poisoning of the first CIG target based on the first reflected radiation.

Another embodiment relates to a sputtering apparatus. The apparatus includes a first copper-indium-gallium (CIG) target in a sputtering chamber and at least one selenium source located adjacent to the CIG target. The apparatus also includes a first shield which partially surrounds the first CIG target and at least one window located in the first shield, the at least one window having a first side facing the first CIG target. The apparatus also includes at least one first fiber optic cable optically connected to a second side of the at least one window and a first radiation source optically coupled to the at least one first fiber optic cable. The apparatus also includes a first detector optically coupled to the at least one first fiber optic cable.

Another embodiment relates to an apparatus. The apparatus includes a means for directing an incident radiation at a copper-indium-gallium (CIG) sputtering target in a reactive CIGS sputtering process and means for detecting a reflected radiation from the CIG target. The apparatus also includes means for determining an amount of selenium poisoning of the CIG target based on the detected reflected radiation.

DETAILED DESCRIPTION

The CIS and CIGS layers of photovoltaic devices may be deposited by evaporation or sputtering. However, it is difficult to make selenium containing sputtering targets. Therefore, when sputter depositing CIS or CIGS layers, a reactive sputtering process is typically used.

In the reactive sputtering process, the deposited layer is formed by a chemical reaction between the target material and a gas which is introduced into the sputtering chamber. To reactively sputter deposit CIS or CIGS, metallic sputtering targets (typically rotating cylinders) of copper-indium or copper-indium-gallium are sputtered in a selenium containing atmosphere. Typically, the atmosphere also contains an inert carrier (or sputtering) gas. By varying the relative pressures of the inert and reactive gases, the composition of the deposited layer can be controlled.

Because selenium is very reactive, it tends to react with the metallic sputtering targets (referred to as selenium poisoning). Further, the reaction with the sputtering target tends to be non-uniform. That is, the concentration of selenium on the metallic cylindrical sputtering target tends to vary across the face of the cylinder both transverse to the axis of rotation and parallel to the axis of rotation. The non-uniformities in the sputtering target lead to compositionally non-uniform sputtered layers in the photovoltaic cell, resulting in non-uniform electrical properties (e.g., I-V characteristics) and non-uniform performance of the photovoltaic cells.

The inventors have realized that the concentration of selenium in or on the sputtering target can be accurately monitored with optical techniques. The inventors have further realized that with a feedback mechanism, sputtering process parameters can be varied in-situ to adjust for non-uniformities in the sputtering target, thereby allowing for the deposition of photovoltaic cell CIS and CIGS absorber layers with substantially uniform composition and with substantially uniform electrical properties.

Figure 1:
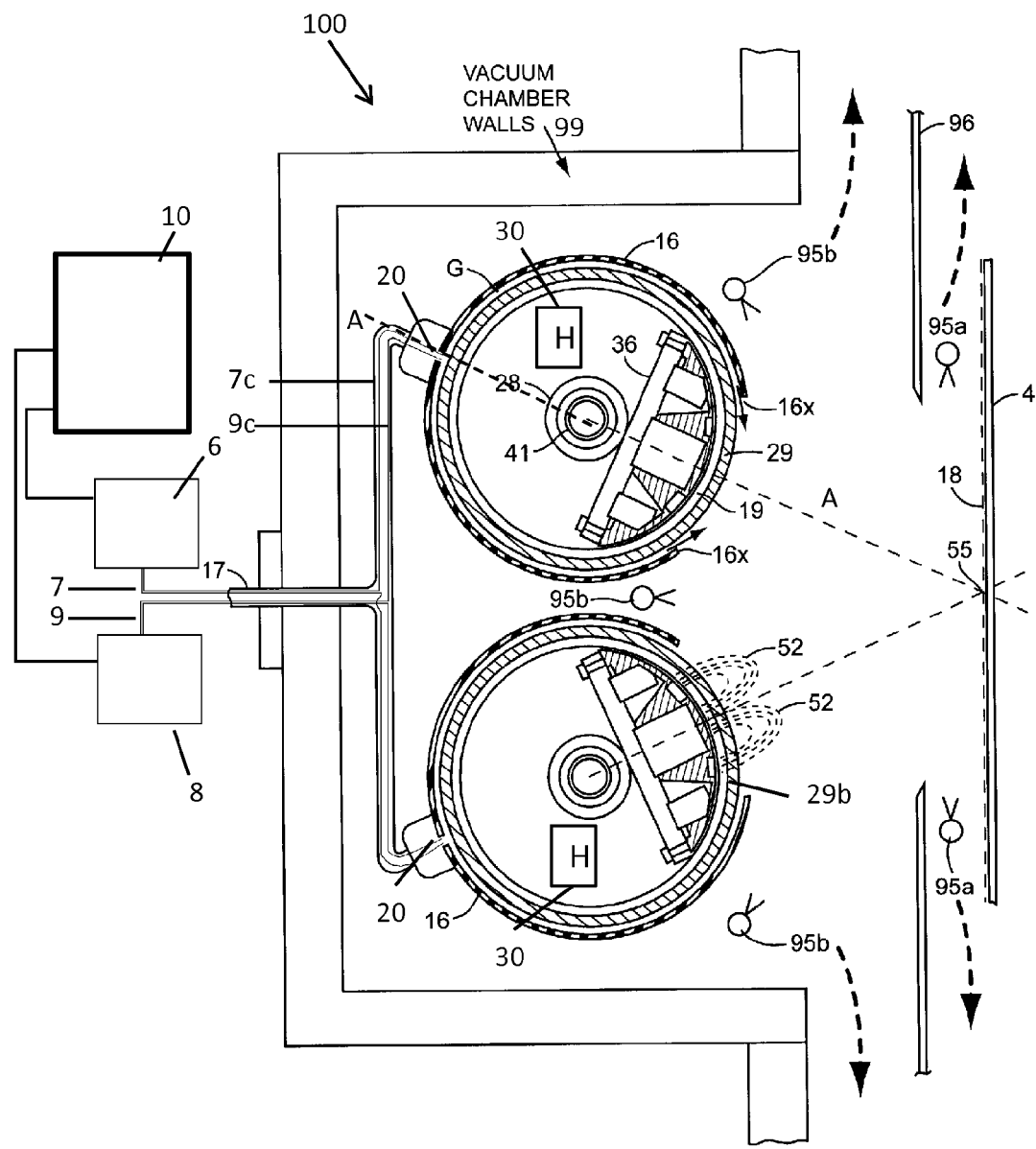
FIG. 1 illustrates a planar cross-sectional view of a sputtering apparatus with dual magnetrons according to an embodiment.

A sputter deposition apparatus 100 according to an embodiment of the invention is illustrated in FIG. 1. In this embodiment, the sputter deposition apparatus 100 is designed for high rate reactive deposition of CIS or CIGS thin films with conductive target materials. This apparatus 100 includes dual magnetron sputtering target assemblies in a vacuum chamber 99 and target protection devices, such as shields 16, to protect the CIG targets from attack by the reactive gas. In an alternative embodiment, the sputter deposition apparatus 100 only includes a single magnetron sputtering target assembly. Each magnetron target assembly includes a target 29, such as copper indium or copper indium gallium target, a target backing tube 19, a magnet assembly 36, support and water transfer tubes 28 and 41, and shield 16. To deposit CIGS, the sputtering target 29 material typically comprises a copper-indium-gallium alloy and the reactive gas comprises selenium. During the sputtering operation, the target 29 along with the target backing tube 19 rotate with respect to magnet assembly 36. Magnet assembly 36 supports a sputtering plasma in the region of arched magnetic fields 52 which causes target material 29 to be deposited on a substrate 4 at position 55. Substrate 4 is preferably a moving metal web as described in U.S. Pat. No. 7,838,763 and U.S. patent application Ser. No. 12/379,428, filed on Feb. 20, 2009 and published as U.S. published application 2010/0212733 A1, both of which are hereby incorporated by reference in their entirety. Alternatively, the substrate may be stationary. A stationary substrate may be made of metal, polymer or glass.

The shield 16 has a generally clam shell shape and may be configured as an electrical anode. As such, the shield 16 may be constructed from a conducting material (usually a metal). In this embodiment, shield 16 may also have an additional function useful for reactive sputtering. The shield 16 may act as an element which allows a thin "sputtering gas curtain", e.g., argon curtain, to exist in a narrow annular gap, G, around those regions of the target 29 which are not being sputtered during its rotation as described in U.S. Pat. No. 6,488,824, hereby incorporated by reference. For instance, argon sputtering gas may be introduced into tube 17 and allowed to flow and divide to feed equally into each gap, G, at respective positions along each of the shields 16 that are approximately 180 degrees from the magnetic assembly 36. In each magnetron, the argon then flows around the target 29 and enters the sputtering area at the edges of cutout 16x. Deposition shield 96 prevents high angle, low energy sputtered material from reaching the substrate position. The heavy dashed arrows indicate the direction of gas flow toward vacuum pumps (not shown) which in this case are attached to a main vacuum chamber 99. Selenium sources 95a, 95b, such as selenium evaporation sources which evaporate selenium into the chamber 99 volume are located adjacent to the target 29. Alternatively, sources 95a, 95b may comprise hydrogen selenide gas nozzles. The reactive gas (e.g., selenium gas or hydrogen selenide gas) may be introduced near the substrate 4 at from sources 95a and/or 95b outside of shields 16.

In this embodiment, the sputtering gas total pressure in the vacuum chamber can be relatively low (e.g., of the order of a millitorr or less) while the sputtering gas pressure in gap, G, can be higher (e.g., a few millitorr). The higher pressure plus the sweeping action of the sputtering gas in the gap due to its flow keeps the region of the gap free of reactive gas. Thus the surface of the target 29 is maintained in a state substantially free of reactive gas products during the reactive sputtering operation. This allows the apparatus to produce superior quality CIGS films while maintaining a very constant process over the lifetime of the target tube. Added control sensitivity can be achieved by admitting the reactive gas into the system by way of a fast acting valve. Piezoelectric valves with response times of a few milliseconds or less are available and suitable for this purpose.

The sputter deposition apparatus 100 also includes a radiation source 6 and a radiation detector 8. In an embodiment, the radiation source 6 and the radiation detector 8 are located outside of the vacuum chamber 99. The radiation source 6 may be, for example, a laser or lamp. The radiation source 6 may be configured to emit visible, infrared, or ultraviolet radiation. Coupled to the radiation source 6 are first radiation conducting fiber(s) 7 (for example, an optical fiber). Typically, a first radiation conducting fiber 7 is provided for each target 29. In the embodiment illustrated in FIG. 1, the first radiation conducting fiber 7 passes through the wall of the vacuum chamber 99 and is positioned to deliver radiation from the radiation source 6 to the surface of the target 29 in the shield 16 area. The first radiation conducting fiber 7 may be located within the tube 17 or outside of the tube 17.

Second radiation conducting fiber(s) 9 may be coupled to the radiation detector 8. Similarly to the first radiation conducting fiber(s) 7, the second radiation conducting fiber(s) 9 pass through the wall of the vacuum chamber 99. The second radiation conducting fiber 9 is positioned to detect radiation reflected from the surface of the target 29 and conduct the detected radiation to the radiation detector 8. As with the first radiation conducting fibers 7, the second radiation conducting fibers 9 may be located within the tube 17 or outside of the tube 17. In an embodiment, the first and second radiation conducting fibers 7, 9 are located behind a window 20 in the shield 16. In this manner, the first and second radiation conducting fibers 7, 9 can be protected from the reactive gas (e.g., selenium).

Figure 2:
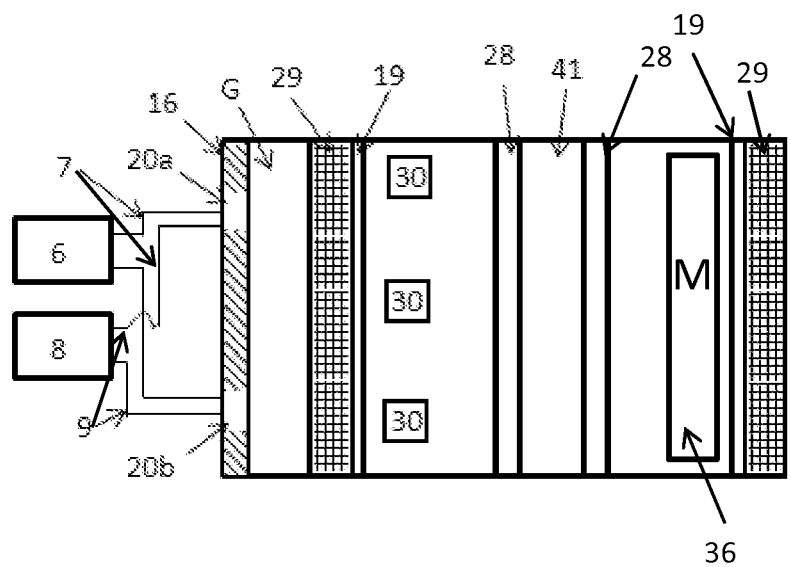
FIG. 2 illustrates a side cross-sectional view of a sputtering apparatus configured for axial determination of selenium poisoning according to an embodiment.

In an embodiment, the sputter deposition apparatus 100 includes a controller 10. The controller 10 may be a general or special purpose computer or dedicated control processor or chip. The controller 10 may be configured to determine the amount of selenium poisoning in or on each of the targets 29 as a function of location on the surface of the targets 29. The controller 10 may further be configured to provide feedback to various components in the sputter deposition apparatus 100 and thereby control the deposition process by controlling one or more process parameters. Process parameters that may be controlled by the controller 10 include, but are not limited to, the temperature of one or more optional heaters 30 adjacent to a portion of the sputtering targets 29, water temperature/flow rate in conduits 28/41 and/or the flux of reactive vapor (e.g., selenium) from sources 95a and/or 95b. The optional heater 30 may be located inside of the hollow support 19 as shown in FIGS. 1 and 2, embedded in shield 16 as a thin resistive heater, or be located outside of but near the shield 16. If a first portion of the sputtering target 29 is determined to have a lower selenium concentration or poisoning than another portion, then the uniformity of the sputter deposited layer may be improved, for example, by increasing the temperature of the first portion of the sputtering target 29, thereby increasing the selenium concentration or poisoning to achieve a more uniform selenium poisoning of the target 29.

Figure 3:
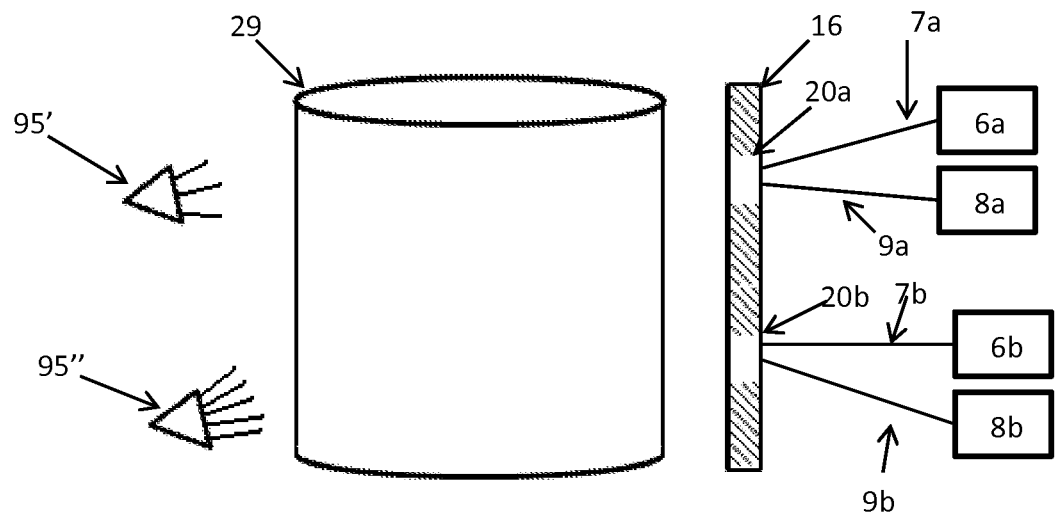
FIG. 3 illustrates a side cross-sectional view of a sputtering apparatus configured for axial determination of selenium poisoning with multiple radiation sources and detectors according to another embodiment.

Alternatively, the flux from one of the selenium sources 95a, 95b near the first portion of the sputtering target 29 may be increased to provide more selenium to the first portion, without a corresponding increase in selenium from the selenium sources 95a, 95b near the second portion of the sputtering target 29. FIG. 3 illustrates an embodiment configured for improving the selenium uniformity in the target axial direction. This embodiment includes two selenium sources 95' and 95" located at different axial positions adjacent to the sputtering target 29. Each of the selenium sources 95' and 95" can be independently controlled and thereby provide more or less selenium as desired to different axial portions of the sputtering target 29. Alternative embodiments may include three, four or more selenium sources 95 as desired.

In an embodiment, the sputter deposition apparatus 100 includes multiple first and second radiation conducting fibers 7, 9 for each sputtering target 29 as shown in FIG. 2. FIG. 2 is a side cross sectional view along line A-A in FIG. 1 with the location of radiation source 6, detector 8 and controller 10 shown schematically. In this manner, the selenium concentration at several different locations (e.g., axial locations) on the surface of the sputtering target 29 can be monitored simultaneously. In an alternative embodiment shown in FIG. 3, the sputtering deposition apparatus 100 includes multiple radiation sources 6a, 6b and/or multiple radiation detectors 8a, 8b. Each of the radiation sources 6 and/or radiation detectors 8 may include a respective dedicated first radiation conducting fiber 7a, 7b and a second radiation conducting fiber 9a, 9b.

Further, each of the radiation sources 6a, 6b and/or radiation detectors 8a, 8b may be associated with its own window 20a, 20b which are located in different axial positions in the shield 16.

Figure 4:
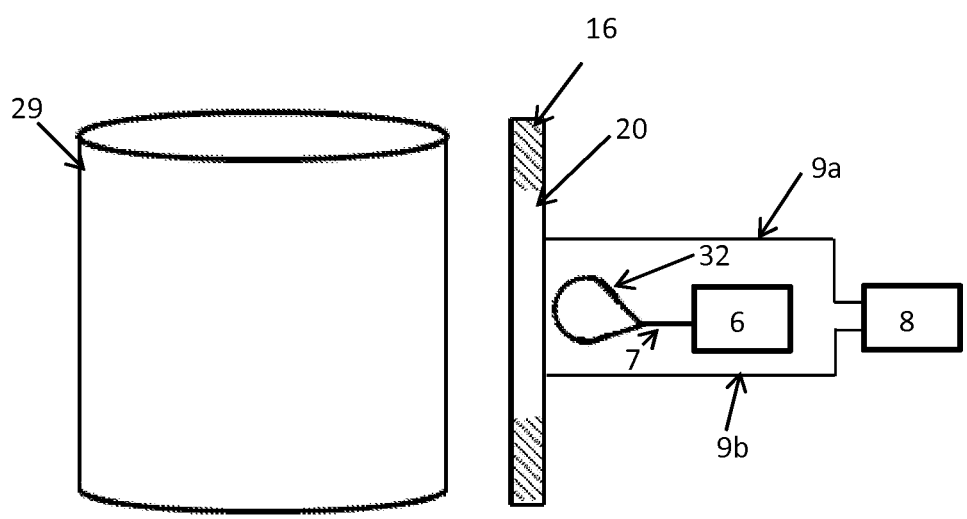
FIG. 4 illustrates a side cross-sectional view of a sputtering apparatus configured for axial determination of selenium poisoning with a scanning radiation source according to another embodiment.

FIG. 4 illustrates an alternative embodiment that includes a single radiation source 6, a single radiation detector 8, a single first radiation conducting fiber 7 and multiple second radiation conducting fibers 9a, 9b. This embodiment also includes an optical scanner 32 attached to the first radiation conducting fiber 7. As illustrated in FIG. 4, the shield 16 includes a single large window 20. Alternatively, the shield 16 may be configured with plural windows 20 and/or plural detectors 8 as shown in FIG. 3. The scanner 32 scans radiation from source 6 through window onto the target 29 in an axial direction with respect to the target, while reflected radiation from different target axial positions is transmitted to detector 8 through window 20 via fibers 9a, 9b.

Additionally, the controller 10 can be configured to detect selenium coating on the window 20 and to take into account the effect of this coating on the determination of selenium poisoning of the sputtering targets 29. In an embodiment, the wavelength of the radiation source 6 may be adjusted to a wavelength suitable to burn off the selenium coating on the window 20. In this way, the window may be periodically cleaned. In an alternative embodiment, rather than change the wavelength of the radiation source 6, a second radiation source may be provided with an output directed through fiber 7 which is set to a wavelength suitable to burn off the coating.

As illustrated in FIG. 1, the shields 16 have a cutout 16x on one side of the sputtering target 29 facing toward the substrate 4. The radiation conducting fibers 7, 9 may be advantageously located on an opposite side of the sputtering targets 29 as the cutout 16x, away from the regions of arched magnetic fields 52 in which the sputtering target is actively being sputtered. The sputtering targets 29 are preferably rotating cylinders. The cylinders may be oriented horizontally (the axis of rotation perpendicular to the force of gravity) or vertically (the axis of rotation parallel to the force of gravity). In a vertical configuration, non-uniformities in selenium poisoning tend to form in the axial direction. That is, the concentration of selenium on the top of the rotating cylindrical sputtering target 29 tends to be different from the selenium concentration on the bottom of the rotating target 29.

In an embodiment of a method according to the present invention, the method includes the steps of directing a first radiation (e.g, UV, visible, IR) from radiation source 6 through first radiation conducting fiber 7 at a first copper-indium-gallium (CIG) sputtering target 29 in a reactive CIGS sputtering process and detecting the reflected radiation at the radiation detector 8 via second radiation conducting fiber 9 from the first CIG target 29. The method also includes the step of determining the amount of selenium poisoning of the first CIG target based on the first reflected radiation. In an embodiment, the first CIG target 29 is cylindrical and rotates about its axis during the sputtering process.

Methods of detecting the selenium poisoning as a function of axial position on the surface of the cylindrical target can be understood with reference to FIGS. 2-4. In the embodiment illustrated in FIG. 2, the shield has a window 20a located in a first axial (e.g., an upper) portion of the shield 16 and a window 20b located in a second axial (e.g., a lower) portion of the shield 16. The radiation source 6 can send pulses of radiation serially or simultaneously through first radiation conducting fibers 7 through the windows 20a, 20b. The radiation sent through window 20a impinges on a first axial (e.g., an upper) portion of the sputtering target 29 while the radiation sent through window 20b impinges on a second axial (e.g., a lower) portion of the sputtering target 29. The reflected light is carried through respective upper and lower second radiation conducting fibers 9 to the radiation detector 8. In this manner, the level of selenium poisoning can be determined in two different axial positions on the sputtering target 29. Further, as discussed above, additional windows 20 and/or fibers 7 and/or 9 may be provided to measure the selenium poisoning, allowing the measurement of the selenium poisoning at more than two axial locations on the surface of the sputtering target 29.

In the embodiment illustrated in FIG. 3, separate radiation sources 6a, 6b, detectors 8a, 8b, first (i.e., input) fibers 7a, 7b and second (e.g., return) fibers 9a, 9b are associated with each window 20a, 20b. As in the previous embodiment, more than two windows 20a, 20b can be provided. In this embodiment, if a single radiation source 6 or detector 8 fails, the sputtering deposition apparatus 100 may still be used, in particular if more than two windows 20a, 20b are provided. If a single detector 8 or radiation source 6 from plural sources or detectors fails, then the value at the unknown position can be estimated by interpolation or extrapolation.

FIG. 4 illustrates an embodiment of determining the selenium concentration in the axial direction by scanning radiation in the target axial direction across the surface of the sputtering target 29 with an optical scanner 32. The radiation is provided from source 6 to scanner via fiber 7. In this embodiment, the detection of the reflected radiation may be accomplished with multiple second radiation conducting fibers 9 positioned in the axial direction. As illustrated, the reflected radiation may be detected with one radiation detector 8. Alternatively, the reflected radiation may be detected with multiple radiation detectors 8a, 8b and multiple fibers 9a, 9b as illustrated in FIG. 3.

Additionally, in the above methods, the concentration of the selenium (i.e., the amount of selenium poisoning) in or on the sputtering target 29 may be determined in situ. That is, the concentration of the selenium in the sputtering target 29 may be determined while the reactive sputtering process in ongoing.

In another embodiment of the method, the measurement of the axial variation in the selenium concentration of the sputtering target 29 is used to change a process parameter to homogenize the selenium concentration or poisoning of target 29 by increasing the poisoning of the portion that is under poisoned. For example, the temperature of a selenium poor portion of the sputtering target 29 can be increased to increase the selenium concentration or poisoning of that portion. The temperature may be raised by increasing the temperature to one or more heaters 30 located adjacent to the less poisoned axial portion(s) of the sputtering target 29 without a corresponding increase in temperature to heater(s) located adjacent to the more poisoned axial portion(s) of the target. Alternatively, the evaporation rate of the selenium sources 95 near the less poisoned portion of the target 29 can be increased to increase the flux of selenium to the selenium poor portion of the surface of the sputtering target 29 (see FIG. 3).

In another embodiment, the sputter deposition apparatus 100 includes a second CIG sputtering target 29b and another first radiation conducting fiber 7c and second radiation conducting fiber 9c, as shown in FIG. 1. The fibers 7c and/or 9c associated with the second target 29b may be connected to the same respective source 6 and detector 8 as the fibers associated with the first target 29. The method of this embodiment includes the steps of determining the relative selenium concentrations or poisoning of the first and second sputtering targets 29, 29b. If one of the two sputtering targets is determined to have a lower selenium concentration or poisoning than the other, the method also includes the step of increasing the selenium concentration or poisoning of the sputtering target with the lower selenium concentration. This may be accomplished by raising the temperature of the sputtering target with adjacent heaters 30 and/or less water flow in the water transfer tubes 28, 41 in the support of the selenium poor target (without a corresponding increase in heater temperature and/or decrease in water flow in the other target), and/or increasing the flux of selenium by increasing the output of the selenium sources 95 near the selenium poor target without a corresponding increase from the other selenium sources 95 near the selenium rich target.

Another embodiment of the method is drawn toward methods of determining the amount of selenium poisoning. In this embodiment, the amount of background noise from reflected radiation from the sputtering target 29 is determined. In this method, a reference beam is directed toward the sputtering target 29 and the reflected reference radiation is measured using the radiation detector 8 or another ancillary radiation detector. The amount of selenium poisoning is determined by subtracting the background noise from the in situ measured selenium. In an alternative embodiment, the amount of selenium poisoning is determined by measuring the change in reflectance of the reflected radiation as a function of time or by comparing the reflectance of the first reflected radiation to a reference reflectance value. This method takes advantage of the fact that the amount of reflected radiation is a function of the surface coverage of selenium. That is, the amount of reflected radiation can be correlated with the amount of selenium on the surface of the sputtering target 29.

In an embodiment, the reference beam and the in situ measuring beam have the same wavelength (i.e., essentially the same single wavelength for ultra narrow band radiation beam, such as an LED or laser beam, or the same peak wavelength for a broader band radiation beam, such as a lamp beam). Alternatively, the reference beam and the in situ measuring beam have different wavelengths (i.e., different single wavelength for ultra narrow band radiation beam, such as an LED or laser beam, or a different peak wavelength for a broader band radiation beam, such as a lamp beam).

In an embodiment, each of the one or more first radiation conducting fibers 7 provides radiation in which the reference (first) beam and the in situ measuring (second) beam have different wavelengths. The first radiation beam is directed to the sputtering target 29 and a reflected radiation is measured. The second radiation beam having a different wavelength is directed through the same fiber to the same position on the sputtering target 29 and a reflected radiation is measured. The selenization can be defined as proportional to the ratio or difference of the amplitude of the reflected wavelengths from appropriately chosen reflected wavelengths. Use of the ratio or different of amplitude of two wavelengths is advantageous because this method removes many variations in the reflected light intensity that are separate from the selenization level of the target. These variations include, but are not limited to, variations in the intensity of the incident light source, effects of movement of the target on the reflected light intensity, effects of a wavelength neutral coating forming on the window, etc.

The two radiation wavelengths could be from two different color light sources and sent serially in time through the fiber. Alternatively, the two radiation wavelengths could be combined together to form a single multi-color radiation. Alternatively, the two radiation wavelengths could be a single broadband light source (e.g., white light) that covers the entire wavelength range. In this case, the detector could measure the continuum of reflected wavelength or only the two reflected wavelengths of interest.

In another embodiment, the incident radiation is chopped (i.e., cycled on/off) using an optical beam chopper or by turning the radiation source on and off to reduce the effects of the optical noise on the measurement. The amount of selenization can be determined by the difference between the amplitude of the measured reflected radiation in the "on" periods and the amplitude of the detected reflected radiation in the "off" periods. The noise is decreased or removed from the selenization measurement by subtracting the amplitude of the measured reflected radiation during the "off" periods from the amplitude of the reflected radiation measured during the "on" period, since only the optical noise signal would be detected during the "off" period. Alternatively, a ratio of the "on" to "off" period detected radiation may be used. The ratio determination or subtraction may be conducted by a computer or other suitable processor after the detector converts the detected reflected radiation into an electrical signal or data. Alternatively, in order subtract the electronic noise in the detected signal, the reflected radiation may be chopped and a difference or ratio of the detected signals used to determine selenization.

Alternatively, the amount of selenization can be determined with lock-in amplification of the data or signal corresponding to the detected reflected radiation. A lock-in amplifier extracts a desired signal from a noisy signal environment by multiplying the signal by a sinusoidal function with the same frequency as the desired signal and integrating over a time much longer than the period of the two functions. After integration, signals that are not at the same frequency as the desired function are reduced to zero, leaving only the desired signal.

In an alternative embodiment, the amount of selenium poisoning is determined by measuring a change in roughness of the surface of the sputtering target 29 as a function of time or comparing a measured roughness of the surface of the sputtering target 29 to a reference roughness value. This is possible because the surface roughness may be correlated to the selenium concentration on the surface of the sputtering target 29. That is, the surface of a selenium poisoned CIG target is rougher than a pure CIG target (the CIG target gets rougher as the selenium concentration on the surface increases).

In an alternative embodiment of the method, selenium deposited on the window is burned off by irradiating the window with radiation having at least one wavelength that is significantly absorbed by the deposited selenium. This method may performed by changing the radiation wavelength and/or amplitude of the radiation source 6 used to evaluate the selenium poisoning of the sputtering target 29 or by supplying radiation from a second radiation source 6 tuned to an appropriate wavelength to burn off the selenium deposit.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:
1. A method, comprising:
directing a first radiation at a first copper-indium-gallium (CIG) sputtering target in a reactive copper indium gallium selenide (CIGS) sputtering process;

detecting a first reflected radiation from the first CIG target;
determining an amount of selenium poisoning of the first CIG target based on the first reflected radiation, and
determining a difference in an amount of selenium poisoning between a first axial portion and a second axial portion of the first CIG target based on the first reflected radiation.

2. The method of claim 1, further comprising:
a shield which partially shields the first CIG target;
at least one window located in the shield and facing the first CIG target;
at least one fiber optic cable optically connected to the at least one window;
a substrate facing the first CIG target through an opening in the shield;
at least one selenium source facing the substrate;
a first radiation source which emits the first radiation; and
a first detector which detects the first reflected radiation.

3. The method of claim 2, wherein:
the first CIG target comprises a cylindrical target;
the first CIG target rotates about its axis during the reactive CIGS sputtering process;
the shield has a clamshell shape which partially surrounds the first target CIG;
the opening in the shield faces the substrate;
the at least one selenium source comprises plural selenium evaporation sources located adjacent to the first CIG target and arranged in an axial direction of the first CIG target; and
the least one fiber optic cable provides the first radiation from the first radiation source through the at least one window at the first CIG target and provides the first reflected radiation from the at least one window to the first detector.

4. The method of claim 3, wherein the reactive CIGS sputtering process comprises sputtering CIG from the first CIG target into a plasma toward the substrate and evaporating selenium from the plural selenium evaporation source into the plasma toward the substrate to form a CIGS layer on the substrate.

5. The method of claim 1, wherein the first radiation comprises visible, IR, or UV radiation and the first CIG target comprises a cylindrical target which rotates about its axis.

6. The method of claim 1, further comprising scanning a beam of the first radiation from a first axial portion of the first CIG target to a second axial portion of the first CIG target while the first CIG target rotates past the beam of the first radiation.

7. The method of claim 1, wherein:
directing the first radiation at the first CIG target comprises directing a beam of the first radiation at a first axial portion of the first CIG target; and
detecting the first reflected radiation comprises detecting the first reflected radiation from the first axial portion of the first CIG target.

8. The method of claim 7, further comprising:
directing a beam of second radiation at a second axial portion of the first CIG target simultaneously with directing the beam of the first radiation at the first axial portion of the GIG target;
detecting a second reflected radiation from the first CIG target; and
determining the difference in the amount of selenium poisoning based on a comparison of the detected first and second radiation.

9. The method of claim 1, further comprising increasing an amount of selenium poisoning of one of the first axial portion of the first CIG target or the second axial portion the first CIG target which is determined to have a lower amount of selenium poisoning than the other one of the first axial portion of the first CIG target or the second axial portion the first CIG target to achieve a substantially uniform amount of selenium poisoning between the first and the second axial portions of the first CIG target.

10. The method of claim 9, wherein increasing the amount of selenium poisoning comprises heating the one of the first axial portion of the first CIG target or the second axial portion the first CIG target to a higher temperature than the other one of the first axial portion of the first CIG target or the second axial portion the first CIG target.

11. The method of claim 9, wherein increasing the amount of selenium poisoning comprises providing a higher selenium flux to the one of the first axial portion of the first CIG target or the second axial portion the first CIG target than to the other one of the first axial portion of the first CIG target or the second axial portion the first CIG target.

12. A method, comprising:
directing a first radiation at a first copper-indium-gallium (CIG) sputtering target in a reactive copper indium gallium selenide (CIGS) sputtering process;
detecting a first reflected radiation from the first CIG target;
determining an amount of selenium poisoning of the first CIG target based on the first reflected radiation;
directing a beam of second radiation at a second CIG target located in a same sputtering chamber as the first CIG target simultaneously with directing a beam of the first radiation at the first CIG target;
detecting a second reflected radiation from the second CIG target; and
determining a difference in an amount of selenium poisoning between the first CIG target and the second CIG target based on a comparison of the detected first and second radiation.

13. The method of claim 12, further comprising increasing an amount of selenium poisoning of one of the first CIG target or the second CIG target which is determined to have a lower amount of selenium poisoning than the other one of the first CIG target or the second CIG target to achieve a substantially uniform amount of selenium poisoning between the first and the second CIG targets.

14. The method of claim 13, wherein increasing the amount of selenium poisoning comprises heating the one of the first CIG target or the second CIG target to a higher temperature than the other one of the first CIG target or the second CIG target.

15. The method of claim 13, wherein increasing the amount of selenium poisoning comprises providing a higher selenium flux to the one of the first CIG target or the second CIG target than to the other one of the first CIG target or the second CIG target.

16. The method of claim 1, further comprising:
directing a reference beam of radiation having a reference wavelength at the first CIG target;
detecting a reference reflected radiation from the first CIG target; and
determining an amount of background noise from the detected reference reflected radiation;
wherein determining the amount of selenium poisoning comprises determining a difference between the detected first reflected radiation and the amount of background noise.

17. The method of claim 1, wherein determining the amount of selenium poisoning comprises measuring a change in reflectance of the first reflected radiation as a function of time or comparing a reflectance of the first reflected radiation to a reference reflectance value.

18. The method of claim 1, wherein determining the amount of selenium poisoning comprises measuring a change in roughness of a surface of the first CIG target as a function of time or comparing a measured roughness of the surface of the first CIG target to a reference roughness value.

19. A method, comprising:
- directing a first radiation at a first copper-indium-gallium (CIG) sputtering target in a reactive copper indium gallium selenide (CIGS) sputtering process;
- detecting a first reflected radiation from the first CIG target;
- determining an amount of selenium poisoning of the first CIG target based on the first reflected radiation;
- directing a second radiation having a different wavelength from the first radiation at a same location on the first CIG target as the first radiation;
- detecting a second reflected radiation from the first CIG target during the step of directing the second radiation; and
- determining the amount of selenium poisoning of the first CIG target based on a difference or a ratio between the first reflected radiation and the second reflected radiation.

20. The method of claim 19, wherein the first and the second radiation are directed through the same fiber optic cable through at least one window at the same location on the first CIG target.

21. The method of claim 1, further comprising reducing an amount of noise in the detected first reflected radiation by at least one of chopping the first radiation or multiplying the first reflected radiation by a sinusoidal function with a same frequency as the first reflected radiation and integrating over a time longer than a period of the first radiation and the sinusoidal function.

22. The method of claim 2, further comprising burning off deposited selenium on the window by irradiating the window with radiation having at least one wavelength that is significantly absorbed by the deposited selenium.

23. A method, comprising:
- directing a first radiation at a first copper-indium-gallium (CIG) sputtering target in a reactive copper indium gallium selenide (CIGS) sputtering process;
- detecting a first reflected radiation from the first CIG target;
- determining an amount of selenium poisoning of the first CIG target based on the first reflected radiation; and
- reducing an amount of noise in the detected first reflected radiation by at least one of chopping the first radiation or multiplying the first reflected radiation by a sinusoidal function with a same frequency as the first reflected radiation and integrating over a time longer than a period of the first radiation and the sinusoidal function.

* * * * *